United States Patent
Gillard et al.

(10) Patent No.: US 9,089,043 B2
(45) Date of Patent: Jul. 21, 2015

(54) DEVICE FOR ATTENUATING PROPAGATION AND RECEPTION OF ELECTROMAGNETIC INTERFERENCE FOR A PCB-CHASSIS STRUCTURE

(71) Applicant: International Business Machines Corporation, Armonk, NY (US)

(72) Inventors: Edward C. Gillard, Mantorville, MN (US); Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 13/948,308

(22) Filed: Jul. 23, 2013

(65) Prior Publication Data

US 2015/0029687 A1    Jan. 29, 2015

(51) Int. Cl.
H05K 5/00 (2006.01)
H05K 9/00 (2006.01)

(52) U.S. Cl.
CPC .................................. H05K 9/0007 (2013.01)

(58) Field of Classification Search
CPC .................................................. H05K 9/0007
USPC ............ 361/753, 679.24, 799–800, 816, 818; 174/394, 350–358, 503.59
See application file for complete search history.

(56) References Cited

U.S. PATENT DOCUMENTS

| 4,242,655 | A | | 12/1980 | Carlson et al. |
| 5,326,937 | A | * | 7/1994 | Watanabe ..................... 174/263 |
| 5,414,223 | A | * | 5/1995 | Suski et al. .................... 174/262 |
| 6,972,967 | B2 | * | 12/2005 | Norte et al. ................... 361/818 |
| 6,999,818 | B2 | | 2/2006 | Stevenson et al. |
| 8,077,472 | B2 | * | 12/2011 | Liu ............................... 361/753 |
| 8,085,548 | B2 | | 12/2011 | Funato et al. |
| 2006/0011369 | A1 | * | 1/2006 | Gilliland et al. ............ 174/35 R |
| 2006/0286866 | A1 | * | 12/2006 | Gilliland et al. .............. 439/610 |
| 2008/0032522 | A1 | * | 2/2008 | Gilliland ......................... 439/74 |
| 2009/0174982 | A1 | * | 7/2009 | Gillard et al. ................. 361/220 |
| 2010/0253367 | A1 | | 10/2010 | Funato et al. |
| 2012/0119757 | A1 | | 5/2012 | Nakamura et al. |
| 2012/0127627 | A1 | * | 5/2012 | Brendel et al. ................ 361/302 |
| 2013/0070387 | A1 | * | 3/2013 | Stevenson et al. ............ 361/302 |

FOREIGN PATENT DOCUMENTS

JP         2001267134         9/2001

* cited by examiner

Primary Examiner — Adrian S Wilson
Assistant Examiner — Abhishek Rathod
(74) Attorney, Agent, or Firm — Jay A. Wahlquist; Robert R. Williams

(57) ABSTRACT

A first substantially annular conductive material has a first central opening, the first central opening is sufficient to substantially surround a fastener and maintain an electrical connection between the printed circuit board and the chassis. A second substantially annular conductive material is concentric with the first conductive material and the second conductive material hays a second central opening which is sufficient to substantially surround the fastener and maintain the electric connection between the printed circuit board and the chassis. A substantially annular impedance material is between and adjacent to the first conductive material and the second conductive material, the impedance material is sufficient to attenuate the electromagnetic interference from the system.

16 Claims, 5 Drawing Sheets

DEVICE FOR ATTENUATING PROPAGATION AND RECEPTION OF ELECTROMAGNETIC INTERFERENCE FOR A PCB-CHASSIS STRUCTURE

FIELD OF INVENTION

This disclosure relates generally to electromagnetic interference from PCB-chassis structures, and more specifically, regards controlling the level of emissions of electromagnetic interference emitted and received by a PCB-chassis structure.

BACKGROUND

Electromagnetic Interference (EMI) is a disturbance that interrupts, obstructs, degrades, or limits the effective performance of electronics and electrical equipment. It can occur unintentionally as a result of spurious emissions and responses. Electromagnetic compatibility (EMC) tries to ensure that equipment items or systems will not interfere with or prevent the correct operation of other equipment items or systems through emission or absorption of EMI. The damaging effects of EMI pose unacceptable risks in many areas of technology and it is necessary to control EMI and reduce the risks to acceptable levels. Printed circuit boards (PCBs) are often mounted to chassis and may emit and receive EMI.

SUMMARY

Disclosed herein are embodiments of a device for attenuating the propagation and reception of electromagnetic interference for a system, the system comprising a printed circuit board mounted a chassis by at least one fastener, the fastener establishing an electrical connection between the printed circuit board and the chassis. In an embodiment, a device may include a first substantially annular conductive material having a first central opening, the first central opening sufficient to substantially surround the fastener and maintain the electrical connection between the printed circuit board and the chassis. In addition, the device may include a second substantially annular conductive material concentric with the first conductive material, the second conductive material having a second central opening sufficient to substantially surround the fastener and maintain the electrical connection between the printed circuit board and the chassis. Furthermore, the device may include a substantially annular impedance material between and adjacent to the first conductive material and the second conductive material, the impedance material sufficient to attenuate the electromagnetic interference from the system.

Also disclosed herein are embodiments of a device for attenuating the propagation and reception of electromagnetic interference for a system, the system comprising a printed circuit board mounted a chassis by at least one fastener, the fastener establishing an electrical connection between the printed circuit board and the chassis. In an embodiment, a device may include a first substantially annular conductive material having a first central opening, the first central opening sufficient to substantially surround the fastener and maintain the electrical connection between the printed circuit board and the chassis. Furthermore, the device may include a substantially annular impedance material adjacent to the first conductive material, the impedance material sufficient to attenuate the electromagnetic interference from the system.

Also disclosed herein are embodiments of a device. In an embodiment, a device may include a first annulus shaped conductive material. In addition, the device may include a second annulus shaped conductive material concentric with the first annulus shaped conductive material. Furthermore, the device may include an impedance material in the shape of a cylinder with a bore between and adjacent to the first annulus shaped conductive material and the second annulus shaped conductive material.

DETAILED DESCRIPTION

Figure 1:
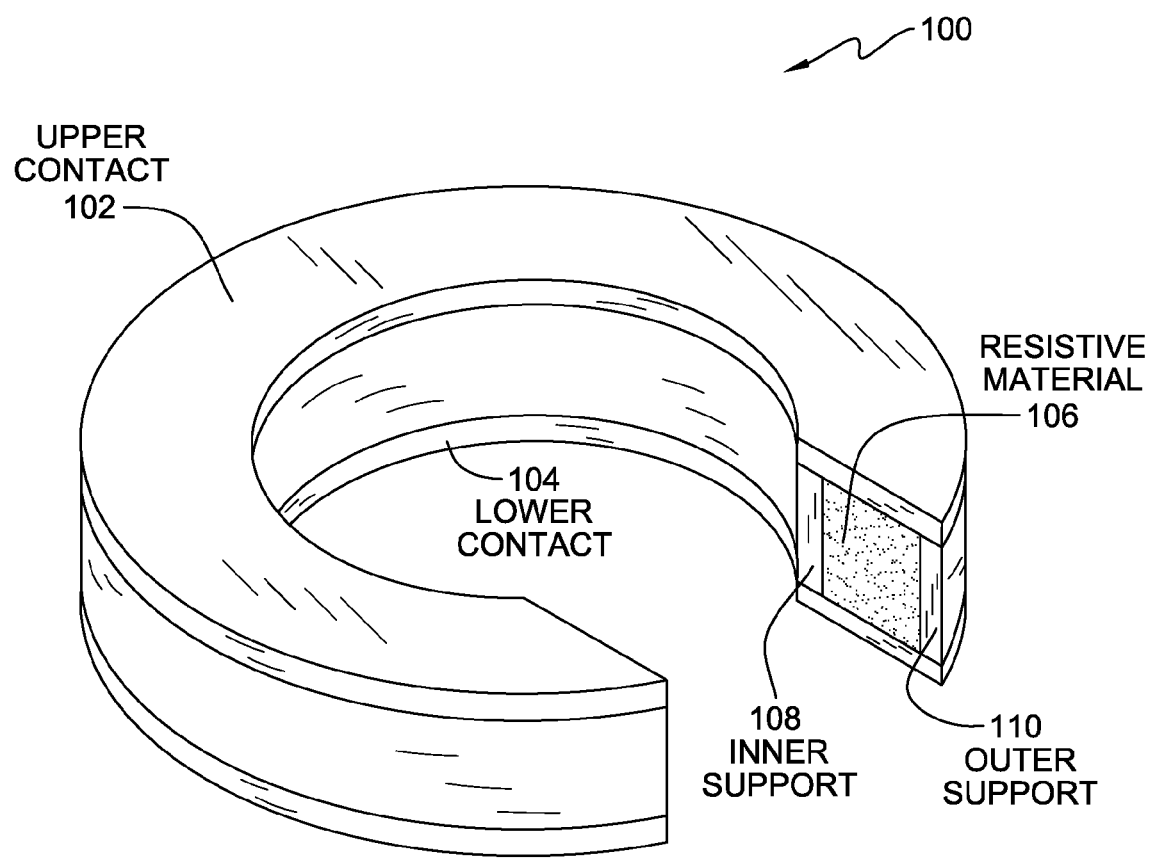
FIG. 1 depicts a resistive device 100 for attenuating the propagation and reception of EMI of a PCB-chassis structure, consistent with embodiments of the present disclosure.

EMI can be divided into two categories according to the source and the signal characteristics. First, there is continuous interference, where the source continuously emits at a given range of frequencies. Continuous interference can be further divided into subcategories based on the range of frequencies, the lowest frequencies being audio frequency, then radio frequency interference (RFI), and finally broadband noise. The second category of EMI is pulse or transient interference, where the source emits a short-duration pulse of energy.

When EMI is emitted, it propagates by the process of coupling. Coupling is the transfer of energy from one medium to another. There are four basic coupling mechanisms: conductive, capacitive, inductive, and radiative. Conductive coupling occurs when the coupling path between the source and the receptor is formed by direct contact with a conducting body, like a transmission line, wire, cable, PCB trace, or metal enclosure. There are two types of conductive coupling, common-mode, where noise appears in phase on two conductors, and differential-mode, where noise appears out of phase on two conductors. Capacitive coupling occurs when a varying electrical field exists between two adjacent conductors, inducing a change in voltage across the gap. Inductive coupling occurs when a varying magnetic field exists between two parallel conductors, inducing a change in voltage along the receiving conductor. Radiative coupling occurs when source and receptor act as radio antennas, that is, the source emits an electromagnetic wave which propagates across open space and is received by the receptor. A coupling path can be broken down into one or more of these coupling mechanisms.

A printed circuit board (PCB) is used in many electronic products. PCBs are assembled with ground planes or board grounds. The board ground may be at 0 V potential, however, currents flow through the finite impedance of the board ground and produce voltage potential differences across the board. The currents that exist in the PCB and board ground produce radio frequency (RF) fields that are emitted from the circuit components present on the PCB. These fields produce voltage differences between PCB and adjacent metallic members of a chassis, a flat metal surface that supports the PCB and the voltage differences create EMI. When there is impedance between the PCB and chassis, the EMI will couple to other equipment items or systems such as the motherboard and daughter boards.

One benefit of assembling a board ground to a PCB is the low-impedance of a board ground. When the board ground is fastened to the chassis with low-impedance connections, the voltage differences between the PCB and chassis are shorted. The EMI that could have coupled to other systems is then diminished. Furthermore, by fastening the board ground to the chassis using low-impedance connections, the board ground is connected to the 0 V potential of the chassis. Therefore, the ground plane should be connected to the chassis unless it is prevented by conflicting circumstances.

A PCB may be fastened directly to a chassis. When a PCB is directly fastened to a chassis, there is a low-impedance connection between the PCB and chassis. To make a direct fasten, mounting pads are placed on the bottom of the PCB and overlap and press against the walls of a metal standoff. The metal standoff, in turn, is wrapped around, in most cases, a screw because of its ability to securely affix one object to another. The metal standoff is also pressed against the chassis and a low-impedance connection is obtained. However, the PCB-chassis structure itself has a frequency at which it resonates. Any circuit currents at this frequency and at higher order multiples of this frequency couple to the structure, causing resonance, and EMI emissions are radiated from the structure. One way to deal with this is to increase the amount of fasteners mounting the PCB to the chassis. This would modify the PCB-chassis structure and increase the frequency at which the PCB-chassis structure resonates. However, this merely causes a shift in the resonant frequency so, although coupling no longer occurs at one frequency, it occurs at another.

Instead of attempting to create a direct, low-impedance connection, by merely adding mounting fasteners, the connections could be replaced by resistive loading. This should dampen the circuit current frequencies and deter the PCB-chassis structure from resonating. A PCB mounted to a chassis in parallel, with an air dielectric, where the PCB has a length W and the distance between the PCB and chassis is h, should exhibit a characteristic impedance $Z_0$ given by:

$$Z_0 = 377 \cdot \frac{h}{W} \cdot \frac{1}{(1 + (h/\pi \cdot W) \cdot (1 + \ln(2\pi W/h))}$$

If the damping value equals the characteristic impedance $Z_0$, the PCB-chassis structure should not resonate. This damping configuration should decrease the EMI generated by the resonation of the PCB-chassis structure, however, it may raise the EMI emissions that are brought about because the PCB no longer has a low-impedance connection with the chassis because the PCB is no longer directly fastened to the chassis.

However, it is also difficult to directly fasten the PCB to the chassis because screws contain a helical thread and the edge of the screw thread touches the standoff. The standoff must be larger in diameter than the screw diameter in order to allow the screw to be properly inserted. As a result, solid and continuous bonding contact between the threads of the screw and the standoff cannot be guaranteed. Furthermore, when different metals are joined, corrosion may occur between the screw and the standoff, disallowing a low-impedance connection. Therefore, screws cannot be relied upon for a direct, low-impedance connection, and hybrid techniques for fastening a PCB to a chassis may be implemented.

Anything besides an open or short is considered a hybrid technique of fastening, such as the resistive loading previously discussed. Another hybrid technique for fastening a PCB to a chassis is through a capacitive connection. There are circumstances where a direct conductive connection between the PCB board ground and the chassis may be undesirable, because of functional, safety, or other requirements. For example, there may be instances where high-level lower frequency interference may be present and multipoint conductive fastening allows this to occur. Therefore, by replacing all fastenings of the PCB-chassis structure except one with a capacitive connection of properly chosen value, a lower frequency grounding and higher frequency grounding connection is obtained, decreasing EMI emissions.

A drawback of the use of hybrid fastening techniques is the series inductance that occurs intrinsically from the device, such as the resistor or capacitor, and the devices connection to the PCB-chassis structure. Excessive series inductance can degrade the effectiveness of the PCB-chassis structure connection, therefore, increasing the EMI emissions. One way to limit the total inductance is to place an inductor in parallel with the series inductance. It is understood that the total inductance of inductors in parallel is equal to the reciprocal of the sum of the reciprocals of their individual inductances:

$$\frac{1}{L_{total}} = \frac{1}{L_1} + \frac{1}{L_2} + \ldots + \frac{1}{L_n}.$$

Therefore, by placing an inductor in parallel with the series inductance, the total inductance is decreased. By decreasing the total inductance, the degrading of the PCB-chassis structure connection is decreased, and EMI emissions are decreased.

Adding inductance, resistance, and capacitance between the board ground of the PCB and the chassis is difficult after the PCB has been assembled and unless area has been dedicated on the PCB for these passive components, locations would have to be designated and popped to implement the requirement. A simpler way is to produce a "washer" shaped component that can either slip into place under the head of the mounting screw or under the PCB and provides the connection between the board ground of the PCB and the chassis.

In this detailed description, reference is made to the accompanying drawings, which illustrate example embodiments. It is to be understood that other embodiments may be utilized and structural changes may be made without departing from the scope of the invention. The terminology used herein is for the purpose of describing particular embodiments only and is not intended to be limiting of the invention. In accordance with features of the invention, a device is provided for attenuating the propagation and reception of EMI of a PCB-chassis structure.

Turning now to the figures, FIG. 1 depicts a resistive device 100 for attenuating the propagation and reception of EMI of a PCB-chassis structure, consistent with embodiments of the present disclosure. An upper contact 102 and a lower contact 104 may be present at the top and bottom of the device 100 and may be composed of conductive material. Conductive material allows for the moveability of the current carrying charged particles, known as electrons, better than other materials like insulators. The use of a conductive material at the upper contact 102 and the lower contact 104 may maintain a lower impedance connection between the PCB and the chassis than if an insulating material is used, therefore, providing a better connection for the signal to travel between the PCB and the chassis.

In certain embodiments, a resistor 106 is an impedance material that may be present between the upper contact 102 and the lower contact 104. A resistor 106 is an electrical component that implements electrical resistance as a circuit element. When a resistor 106 is placed in a circuit, any oscillation induced in the circuit will die away over time if it is not kept going by a source, this effect is called damping. Furthermore, the resistor 106 may also reduce the peak of the resonant frequency. As frequency increases from zero towards resonance, the impedance increases to a maximum value at resonance and then decreases again for frequencies above resonance. PCB-chassis structures display a natural frequency at which they resonate. The geometry of the PCB-chassis structure, the number of fastenings between the PCB and the chassis, the dielectric between the PCB and the chassis, etc. may determine the natural frequency at which the PCB-chassis structure resonates. Circuit signals travel around the PCB and chassis and between the PCB and chassis. Signals with the frequency and higher multiples of the frequency that match the natural frequency at which the PCB-chassis structure resonates, may couple to the PCB-chassis structure, causing the PCB-chassis structure to resonate. This may emit an EMI that may couple to other equipment items or systems and interfere with or prevent their correct operation. However, the PCB-chassis structure also displays a characteristic impedance that may be determined by the geometry of the PCB-chassis structure, the dielectric between the PCB and the chassis, etc. A resistance, that matches the impedance of the characteristic impedance of the PCB-chassis structure, that is placed along the connection between the PCB-chassis structure may reduce the peak of the frequency and higher multiples of the frequency of the signals that match the natural frequency at which the PCB-chassis structure resonates. Therefore, the PCB-chassis structure may not resonate and EMI may not be emitted.

Consistent with certain embodiments, an inner support 108 may be present between the upper contact 102 and the lower contact 104 and along side the resistor 106. The inner support 108 may be assembled in such a way as to accept the forces necessary to mount the device under the head of the fastener or under the PCB. The inner support 108 may protect the resistor 106 from damage that may come about from installation or use. Furthermore, the inner support 108 may be composed of an insulating material. Insulating materials do not allow electric charges to flow freely, therefore, they do not conduct an electric current. Thus, stray signals that may have escaped from the PCB-chassis structure, in the form of EMI, that could have propagated and coupled to other equipment items or systems and interfere with or prevent their correct operation, may be decreased.

In certain embodiments, an outer support 110 may be present between the upper contact 102 and the lower contact 104 and along side the resistor 106, opposite the inner contact 108. The outer support 110 may be assembled in such a way as to accept the forces necessary to mount the device under the head of the fastener or under the PCB. The outer support 110 may protect the resistor 106 from damage that may come about from installation or use. Furthermore, the outer support 110 may be composed of an insulating material. Insulating materials do not allow electric charges to flow freely, therefore, they do not conduct an electric current. Thus, stray signals that may have escaped from the PCB-chassis structure, in the form of EMI, that could have propagated and coupled to other equipment items or systems and interfere with or prevent their correct operation, may be decreased.

Consistent with various embodiments, the device 100 can take any number of different forms. For instance, the device 100 may be circular in shape with an inner circumference and an outer circumference resembling a washer. This may allow the device 100 to be placed underneath the head of a fastener or underneath a PCB. This may also allow the device 100 to dampen the frequency of the signals that may cause the PCB-chassis structure to resonate and area on the PCB may not need to be dedicated to allow for the addition of the resistance. Another embodiment may provide a slot in the device 100. This slot may allow the device 100 to be placed underneath the head of a fastener or underneath a PCB without removing the fastener from the PCB-chassis structure. This may also allow the device to dampen the frequency of the signals that may cause the PCB-chassis structure to resonate and area on the PCB may not need to be dedicated to allow for the addition of the resistance.

Figure 2:
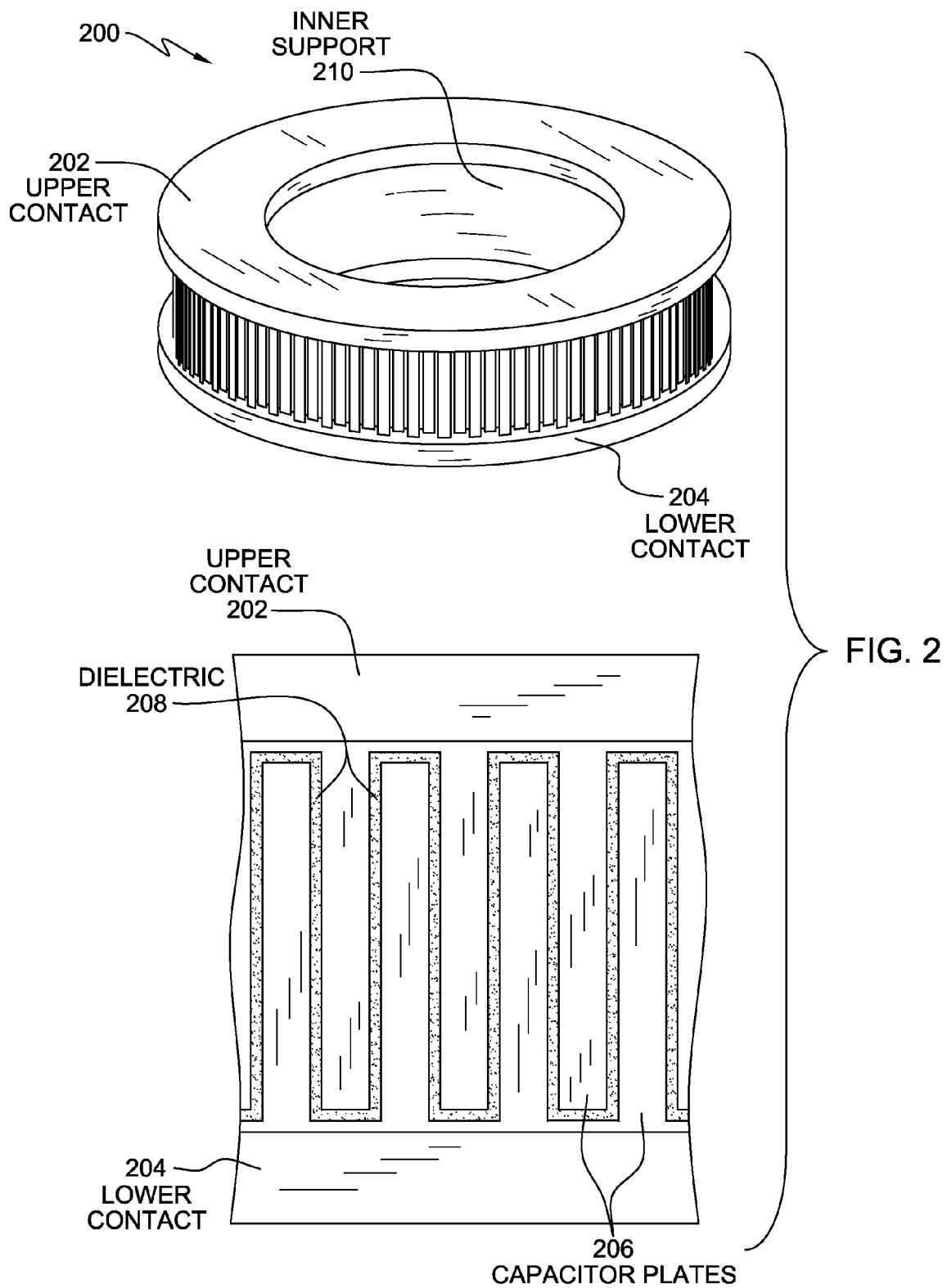
FIG. 2 depicts a capacitive device 200 for attenuating the propagation and reception of EMI of a PCB-chassis structure, consistent with embodiments of the present disclosure.

FIG. 2 depicts a capacitive device 200 for attenuating the propagation and reception of EMI of a PCB-chassis structure, consistent with embodiments of the present disclosure. An upper contact 202 and a lower contact 204 may be present at the top and bottom of the device 100 and may be composed of conductive material. Conductive material allows for the moveability of the current carrying charged particles, known as electrons, better than other materials like insulators. The use of a conductive material at the upper contact 202 and the lower contact 204 may maintain a lower impedance connection between the PCB and the chassis than if an insulating material is used, therefore, providing a better connection for the signal to travel between the PCB and the chassis.

In certain embodiments, a capacitor 206 may be present between the upper contact 202 and the lower contact 204. A capacitor 206 is an electrical component used to store energy electrostatically in an electrical field. A PCB may be mounted to a chassis directly at a single point. This works well for grounding low-frequency signals and decreasing the EMI that is emitted. However, a ground loop or unwanted signals at higher frequencies, may remain present throughout a PCB-chassis structure that is mounted at a single point and this may cause excessive EMI to be emitted by the PCB-chassis structure. Multi-point fastening, therefore, may be required for meeting high-frequency EMI emission requirements. To allow for low-frequency and high-frequency signals to both be grounded for a PCB-chassis structure, the PCB may be connected conductively at one fastener and connected capacitively at the other fasteners to the chassis.

The impedance of a capacitor 206 is inversely proportional to the frequency of the signal. Therefore, a capacitor will have high impedance for low-frequency signals and may act as an open circuit, and will have low impedance for high-frequency signals and may act as a short circuit. Thus, the low-frequency signals may be grounded by the single conductive connection and the high-frequency signals may be grounded by the capacitive connections. To achieve grounding for both low-frequency and high-frequency signals, the proper capacitive connection value may need to be chosen. This may depend on the frequencies of the signals throughout the PCB-chassis structure that may need to be grounded. To obtain the proper capacitive connection, a dielectric 208 may be chosen to be placed between the plates of the capacitor 206. A dielectric 208 is an electrical insulator that can be polarized by an applied electrical field. The dielectric 208 may enable the capacitor 206 to possess the characteristics necessary to ground the low-frequency and the high-frequency signals that may be present throughout the PCB-chassis structure. This may decrease the ground loops or unwanted signals throughout the PCB-chassis structure, therefore, decreasing the EMI emitted.

Consistent with certain embodiments, an inner support 210 may be present between the upper contact 202 and the lower contact 204 and along side the capacitor 206. The inner support 210 may be assembled in such a way as to accept the forces necessary to mount the device under the head of the fastener or under the PCB. The inner support 210 may protect the capacitor 206 from damage that may come about from installation or use. Furthermore, the inner support 210 may be composed of an insulating material. Insulating materials do not allow electric charges to flow freely, therefore, they do not conduct an electric current. Thus, stray signals that may have escaped from the PCB-chassis structure, in the form of EMI, that could have propagated and coupled to other equipment items or systems and interfere with or prevent their correct operation, may be decreased.

Consistent with various embodiments, the device 200 can take any number of different forms. For instance, the device 200 may be circular in shape with an inner circumference and an outer circumference resembling a washer. This may allow the device 200 to be placed underneath the head of a fastener or underneath a PCB. This may also allow the device 200 to decrease the impedance between the PCB and the chassis, therefore, decreasing the EMI emitted by the PCB-chassis structure and area on the PCB may not need to be dedicated to allow for the addition of the capacitance. Another embodiment may provide a slot in the device 200. This slot may allow the device 200 to be placed underneath the head of a fastener or underneath a PCB without removing the fastener from the PCB-chassis structure. This may also allow the device 200 to decrease the impedance between the PCB and the chassis, therefore, decreasing the EMI emitted by the PCB-chassis structure and area on the PCB may not need to be dedicated to allow for the addition of the capacitance.

Figure 3:
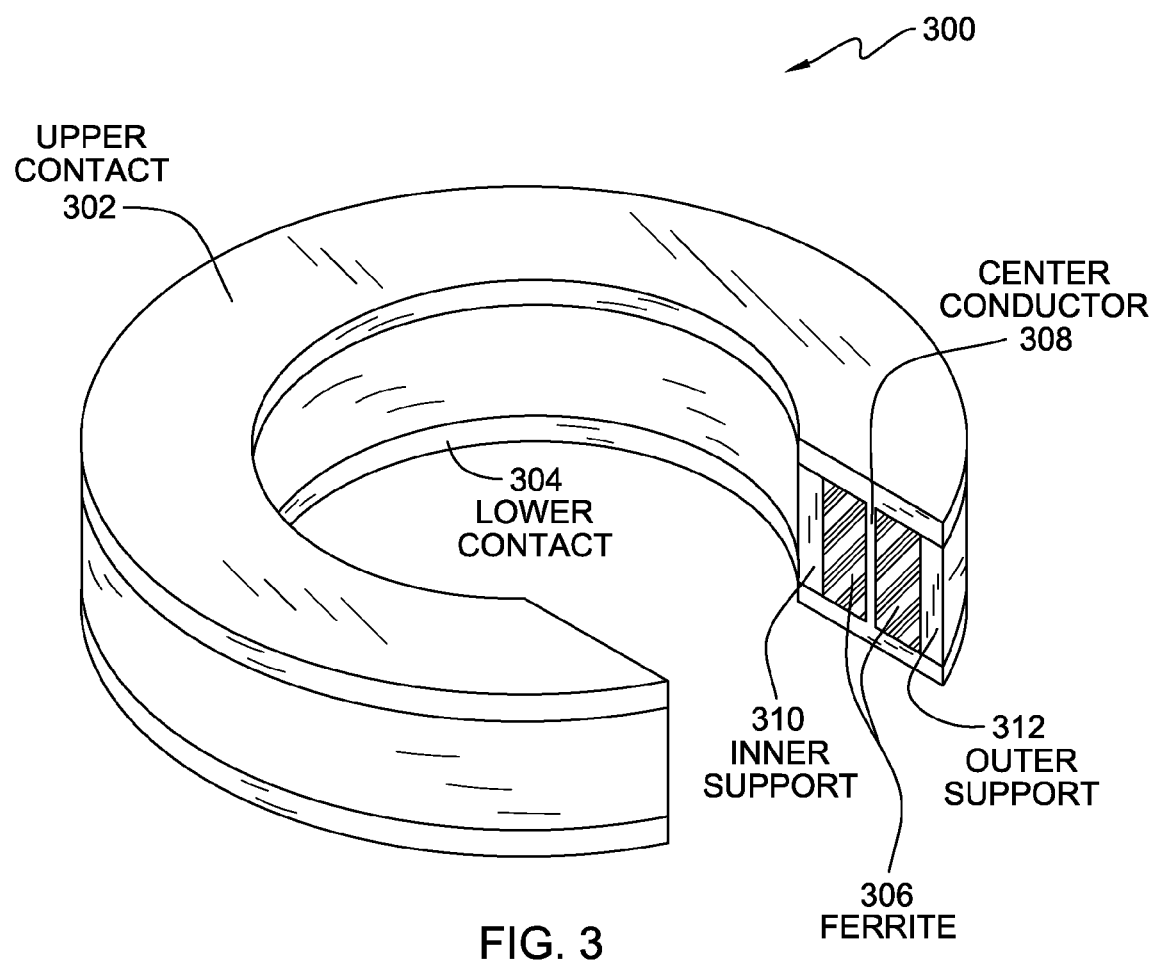
FIG. 3 depicts an impedance device 300 for attenuating the propagation and reception of EMI of a PCB-chassis structure, consistent with embodiments of the present disclosure.

FIG. 3 depicts an impedance device 300 for attenuating the propagation and reception of EMI of a PCB-chassis structure, consistent with embodiments of the present disclosure. An upper contact 302 and a lower contact 304 may be present at the top and bottom of the device 300 and may be composed of conductive material. Conductive material allows for the moveability of the current carrying charged particles, known as electrons, better than other materials like insulators. The use of a conductive material at the upper contact 302 and the lower contact 304 may maintain a lower impedance connection between the PCB and the chassis than if an insulating material is used, therefore, providing a better connection for the signal to travel between the PCB and the chassis.

In certain embodiments, a center conductor 308 may be present between the upper contact 302 and the lower contact 304. The center conductor 308 may also have ferrite material 306 on both of its sides and the ferrite material 306 may also be between the upper contact 302 and the lower contract 304. Ferrite material 306 is usually made of a non-conductive ceramic compound and is magnetic. When a conductor 308 is surrounded by ferrite material 306 it may form a distributed ferrite bead. At lower frequencies a ferrite bead acts like an inductor and at higher frequencies a ferrite bead acts like a resistor. An inductor acts in the opposite way that a capacitor does. For a capacitor, the impedance is large at low frequencies and small at high frequencies. For an inductor, the impedance is small at low frequencies and large at high frequencies. For signals at lower frequencies the ferrite bead may take on the characteristics of an inductor and be met with little impedance. However, for signals at higher frequencies, the ferrite material 306 may have high resistance. The signal may then be forced to continue through the center conductor 308. If the signal were to stray from the path through the center conductor 308, the ferrite material 306 may reflect the stray signal back to the center conductor 308 or the signal may be dissipated as low-level heat. The signal may then be stopped from propagating out of the PCB-chassis structure, in the form of EMI, and coupling to other equipment items or systems and interfere with or prevent their correct operation.

Consistent with certain embodiments, an inner support 310 may be present between the upper contact 302 and the lower contact 304 and along side the ferrite material 306. The inner support 310 may be assembled in such a way as to accept the forces necessary to mount the device under the head of the fastener or under the PCB. The inner support 310 may protect the ferrite material 306 and the center conductor 308 from damage that may come about from installation or use. Furthermore, the inner support 310 may be composed of an insulating material. Insulating materials do not allow electric charges to flow freely, therefore, they do not conduct an electric current. Thus, stray signals that may have escaped from the PCB-chassis structure, in the form of EMI, that could have propagated and coupled to other equipment items or systems and interfere with or prevent their correct operation, may be decreased.

In certain embodiments, an outer support 312 may be present between the upper contact 302 and the lower contact 304 and along side the ferrite material 306, opposite the inner contact 310. The outer support 312 may be assembled in such a way as to accept the forces necessary to mount the device under the head of the fastener or under the PCB. The outer support 312 may protect the ferrite material 306 and the center conductor 308 from damage that may come about from installation or use. Furthermore, the outer support 316 may be composed of an insulating material. Insulating materials do not allow electric charges to flow freely, therefore, they do not conduct an electric current. Thus, stray signals that may have escaped from the PCB-chassis structure, in the form of EMI, that could have propagated and coupled to other equipment items or systems and interfere with or prevent their correct operation, may be decreased.

Consistent with various embodiments, the device 300 can take any number of different forms. For instance, the device 300 may be circular in shape with an inner circumference and an outer circumference resembling a washer. This may allow the device 300 to be placed underneath the head of a fastener or underneath a PCB. This may also allow the device 300 to decrease the amount of stray signals propagating from the PCB and the chassis, therefore, decreasing the EMI emitted by the PCB-chassis structure and area on the PCB may not need to be dedicated to allow for the addition of the impedance material. Another embodiment may provide a slot in the device 300. This slot may allow the device 300 to be placed underneath the head of a fastener or underneath a PCB without removing the fastener from the PCB-chassis structure. This may also allow the device 300 to decrease the amount of stray signals propagating from the PCB and the chassis, therefore, decreasing the EMI emitted by the PCB-chassis structure and area on the PCB may not need to be dedicated to allow for the addition of the impedance material.

Figure 4:
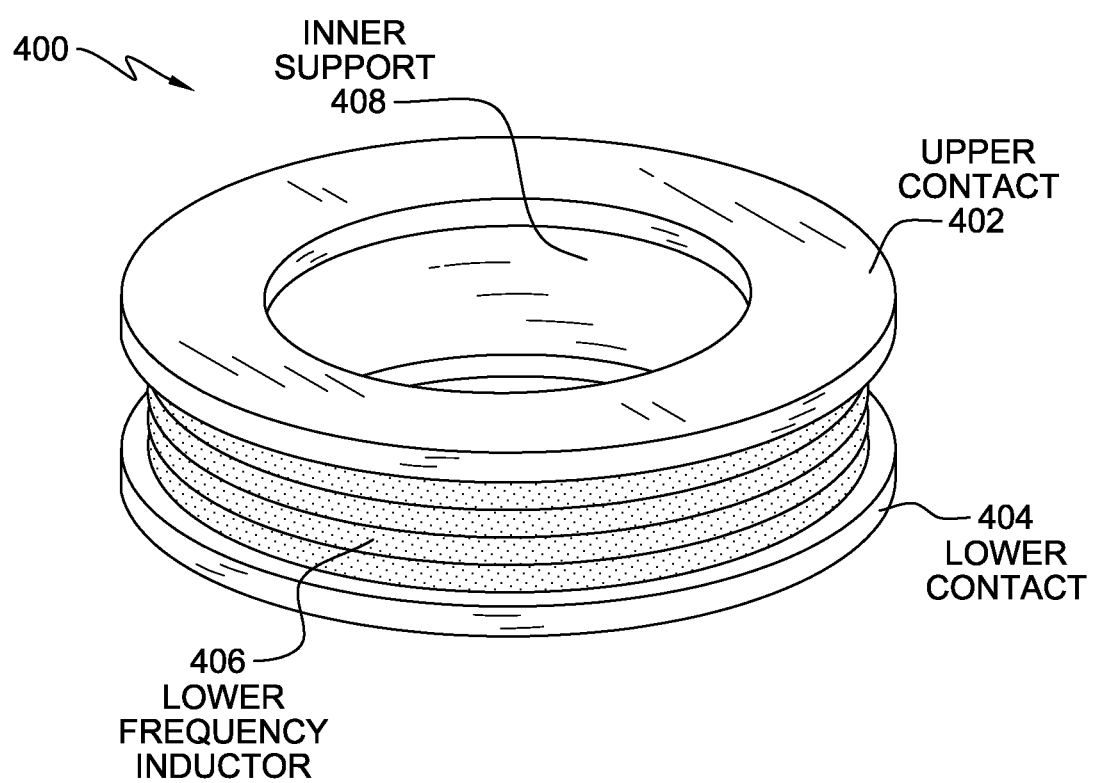
FIG. 4 depicts an inductor device 400 for attenuating the propagation and reception of EMI of a PCB-chassis structure, consistent with embodiments of the present disclosure.

FIG. 4 depicts an inductor device 400 for attenuating the propagation and reception of EMI of a PCB-chassis structure, consistent with embodiments of the present disclosure. Upper contact 402 and lower contact 404 may be present at the top and bottom of the device 400 and may be composed of conductive material. Conductive material allows for the moveability of the current carrying charged particles, known as electrons, better than other materials like insulators. The use of a conductive material at the upper contact 402 and the lower contact 404 may maintain a lower impedance connection between the PCB and the chassis than if an insulating material is used, therefore, providing a better connection for the signal to travel between the PCB and the chassis.

In certain embodiments, an inductor 406 may be present between the upper contact 402 and the lower contact 404. An inductor is an electrical component that resists changes in electric current passing through it and it often consists of a conductor wound into a coil. Fastening a PCB to a chassis should be done with as low impedance as possible. However, when hybrid fastening techniques are applied, the individual devices, such as a resistor or capacitor, have an inherent inductance and create further inductance when connected to the PCB-chassis structure. As discussed, the total inductance of inductors in parallel is equal to the reciprocal of the sum of reciprocals of their individual inductances. By placing an inductor 406 in parallel with the inductance that is inherent to the individual devices and that is created when the individual devices are connected to the PCB-chassis structure, the total inductances may be decreased. An inductor 406 acts in the opposite way that a capacitor does. For a capacitor, the impedance is large at low frequencies and small at high frequencies. For an inductor 406, the impedance is small at low frequencies and large at high frequencies. When the total inductance is decreased by placing the inductor 406 in parallel with the inductance present, the impedance is decreased for higher frequency signals. Therefore, this may decrease the EMI emitted by the PCB-chassis structure.

Consistent with certain embodiments, an inner support 408 may be present between the upper contact 202 and the lower contact 204 and along side the inductor 406. The inner support 408 may be assembled in such a way as to accept the forces necessary to mount the device under the head of the fastener or under the PCB. The inner support 408 may protect the inductor 406 from damage that may come about from installation or use. Furthermore, the inner support 408 may be composed of an insulating material. Insulating materials do not allow electric charges to flow freely, therefore, they do not conduct an electric current. Thus, stray signals that may have escaped from the PCB-chassis structure, in the form of EMI, that could have propagated and coupled to other equipment items or systems and interfere with or prevent their correct operation, may be decreased.

Consistent with various embodiments, the device 400 can take any number of different forms. For instance, the device 400 may be circular in shape with an inner circumference and an outer circumference resembling a washer. This may allow the device 400 to be placed underneath the head of a fastener or underneath a PCB. This may also allow the device 400 to decrease the impedance between the PCB and the chassis, therefore, decreasing the EMI emitted by the PCB-chassis structure and area on the PCB may not need to be dedicated to allow for the addition of the impedance material. Another embodiment may provide a slot in the device 400. This slot may allow the device 300 to be placed underneath the head of a fastener or underneath a PCB without removing the fastener from the PCB-chassis structure. This may also allow the device 400 to decrease the impedance between the PCB and the chassis, therefore, decreasing the EMI emitted by the PCB-chassis structure and area on the PCB may not need to be dedicated to allow for the addition of the impedance material.

Figure 5:
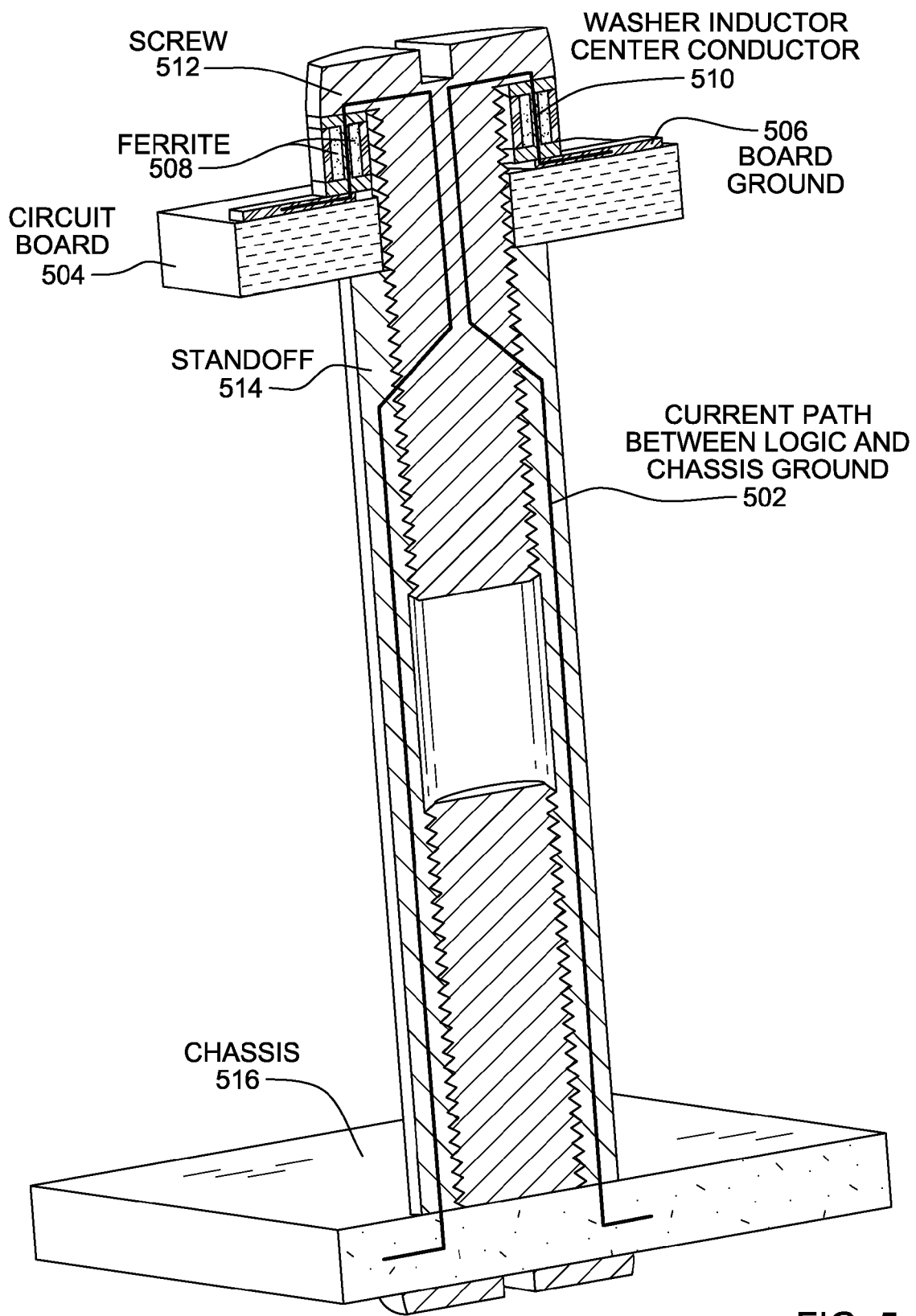
FIG. 5 depicts a cross-sectional view of the signal path between the PCB and chassis, consistent with embodiments of the present disclosure.

FIG. 5 depicts a cross-sectional view of the signal path between the PCB and chassis, consistent with embodiments of the present disclosure. Currents flow through the finite impedance of the board ground 506. Radio frequency currents that exist within the PCB 504 and the board ground 506 produce radio frequency fields that are then emitted from circuit components and interconnected wiring. These fields may couple efficiently to other metallic structures, through impedance, that generate signals 502 that circulate within the PCB 504 and the board ground 506.

The device represented in FIG. 5 is that of FIG. 3, where the device has a center conductor 510 with ferrite material 508 along both sides of the center conductor 510 and may form a distributed ferrite bead. The signal 502 on the left propagates through the lower contact of the device, through the center conductor 510, through the upper contact of the device, up into the screw 512 that may be used as a fastener that mounts the PCB to the chassis, through the screw 512, into the standoff 514, and eventually to the chassis 516. The standoff 514 may be used to achieve a surface contact with the chassis which may exhibit lower impedance than a point contact, had the standoff not been used. The signal 502 on the left went along a relatively straight path which may mean that the signal 502 had a lower frequency and the ferrite bead took on the characteristics of an inductor, having low-impedance for signals at lower frequencies, or the signal 502 may have a higher frequency, but it did not stray from the center conductor 510.

The signal 502 on the right propagates through the lower contact of the device, through the center conductor 510, is reflected back by the ferrite material 508 to the center conductor 510, goes through the upper contact of the device, up into the screw 512, through the screw 512, into the standoff, and eventually to the chassis 516. The signal 502 on the right may be reflected back by the ferrite material 508. This may suggest that the signal 502 on the right had a higher frequency and the ferrite bead took on the characteristics of a resistor, having high-impedance for signals at higher frequencies and when a high-frequency signal strays from the center conductor 510, the ferrite material 508 may reflect the signal back to the center conductor 510 or absorb the signal and dissipate it as low-level heat.

While the invention has been described with reference to the specific aspects thereof, those skilled in the art will be able to make various modifications to the described aspects of the invention without departing from the true spirit and scope of the invention. The terms and descriptions used herein are set forth by way of illustration only and are not meant as limitations. Those skilled in the art will recognize that these and other variations are possible within the spirit and scope of the invention as defined in the following claims and their equivalents.

The invention claimed is:

1. A device for attenuating propagation and reception of electromagnetic interference for a system, the system comprising a printed circuit board mounted to a chassis by at least one fastener, the fastener establishing an electrical connection between the printed circuit board and the chassis, the device comprising:

a first substantially annular conductive material having a first central opening, the first central opening sufficient to substantially surround the fastener and maintain the electrical connection between the printed circuit board and the chassis;

a second substantially annular conductive material concentric with the first conductive material, the second conductive material having a second central opening sufficient to substantially surround the fastener and maintain the electric connection between the printed circuit board and the chassis;

a substantially annular impedance material between and adjacent to the first conductive material and the second conductive material, the impedance material sufficient to attenuate the electromagnetic interference from the system;

a substantially annular, insulator material, inner support structure between and adjacent to the first conductive material and the second conductive material, the inner support structure having an outer diameter smaller than an inner diameter of the impedance material and surrounded by the impedance material, the inner support structure having a third central opening sufficient to substantially surround the fastener;

a substantially annular, insulator material, outer support structure between and adjacent to the first conductive material and the second conductive material, the outer support structure having an inner diameter larger than an outer diameter of the impedance material, the outer support structure substantially surrounding and contacting the impedance material.

2. The device in claim 1, wherein the impedance material is a resistor sufficient to attenuate the electromagnetic interference from the system by lessening a peak of a signal at a resonance frequency and multiples of the resonance frequency of the system by matching a characteristic impedance of the system.

3. The device in claim 1, wherein the impedance material is an inductor sufficient to attenuate the electromagnetic interference from the system by decreasing total inductance of the system by placing the inductor in parallel with inductance present near the first bond.

4. The device in claim 1, wherein the impedance material acts is a capacitor sufficient to attenuate the electromagnetic interference from the system by grounding lower frequency currents and higher frequency currents.

5. The device in claim 1, wherein the impedance material further comprises:

a substantially annular inner ferrite material, the inner ferrite material having an inner diameter larger than the outer diameter of the inner support structure, the inner ferrite material substantially surrounding and contacting the inner support structure;

a third substantially annular conductive material, the third conductive material having an inner diameter larger than the outer diameter of the inner ferrite material, the third conductive material substantially surrounding and contacting the inner ferrite material; and a substantially annular outer ferrite material, the outer ferrite material having an inner diameter larger than the outer diameter of the third conductive material, the outer ferrite material substantially surrounding and contacting the third conductive material.

6. The device of claim 5, wherein the impedance material is sufficient to attenuate the electromagnetic interference from the system by the inner ferrite material and the outer ferrite material reflecting or absorbing stray signals and minimizing the stray signals from propagating.

7. The device of claim 1, wherein the at least one fastener is a screw, the screw having a head, used to fasten the PCB to the chassis, and the device is placed directly underneath the screw head and the first substantially annular conductive material is in direct contact with the screw head and a board ground of the PCB, used for its low-impedance, is directly underneath the device and above the PCB and in direct contact with the second substantially annular conductive material.

8. The device of claim 1, wherein a board ground of the PCB, used for its low-impedance, is below the PCB and the device is directly underneath the board ground and the first substantially annular conductive material is in direct contact with the board ground, and a conductive standoff, used to make a continuous electrical bond, is coupled to the at least one fastener and is directly underneath the device and in direct contact with the second substantially annular conductive material.

9. A device for attenuating propagation and reception of electromagnetic interference for a system, the system comprising a printed circuit board mounted to a chassis by at least one fastener, the fastener establishing an electrical connection between the printed circuit board and the chassis, the device comprising:

a first substantially annular conductive material having a first central opening, the first central opening sufficient to substantially surround the fastener and maintain the electrical connection between the printed circuit board and the chassis;

a substantially annular impedance material adjacent to the first conductive material, the impedance material sufficient to attenuate the electromagnetic interference from the system;

a second substantially annular conductive material concentric with the first conductive material, the second conductive material having a second central opening sufficient to substantially surround the fastener and maintain the electric connection between the printed circuit board and the chassis;

a substantially annular, insulator material, inner support structure adjacent to the first conductive material, the inner support structure having an outer diameter smaller than an inner diameter of the impedance material and surrounded by the impedance material, the inner support structure having a third central opening sufficient to substantially surround the fastener; and a substantially annular, insulator material, outer support structure between and adjacent to the first conductive material and the second conductive material, the outer support structure having an inner diameter larger than an outer diameter of the impedance material, the outer support structure substantially surrounding and contacting the impedance material.

10. The device in claim 9, wherein the impedance material is a resistor sufficient to attenuate the electromagnetic interference from the system by lessening a peak of a signal at a resonance frequency and multiples of the resonance frequency of the system by matching a characteristic impedance of the system.

11. The device in claim 9, wherein the impedance material is an inductor sufficient to attenuate the electromagnetic interference from the system by decreasing total inductance of the system by placing the inductor in parallel with inductance present near the first bond.

12. The device in claim 9, wherein the impedance material acts is a capacitor sufficient to attenuate the electromagnetic interference from the system by grounding lower frequency currents and higher frequency currents.

13. The device in claim 9, wherein the impedance material further comprises:

a substantially annular inner ferrite material, the inner ferrite material having an inner diameter larger than the outer diameter of the inner support structure, the inner ferrite material substantially surrounding and contacting the inner support structure;

a third substantially annular conductive material, the third conductive material having an inner diameter larger than the outer diameter of the inner ferrite material, the third conductive material substantially surrounding and contacting the inner ferrite material; and a substantially annular outer ferrite material, the outer ferrite material having an inner diameter larger than the outer diameter of the third conductive material, the outer ferrite material substantially surrounding and contacting the third conductive material.

14. The device of claim 13, wherein the impedance material is sufficient to attenuate the electromagnetic interference from the system by the inner ferrite material and the outer ferrite material reflecting or absorbing stray signals and minimizing the stray signals from propagating.

15. The device of claim 1, wherein the at least one fastener is a screw, the screw having a head, used to fasten the PCB to the chassis, and the device is placed directly underneath the screw head and the impedance material is in direct contact with the screw head and a board ground of the PCB, used for its low-impedance, is directly underneath the device and above the PCB and in direct contact with the first substantially annular conductive material.

16. The device of claim 1, wherein a board ground of the PCB, used for its low-impedance, is below the PCB and the device is directly underneath the board ground and the impedance material is in direct contact with the board ground, and a conductive standoff, used to make a continuous electrical bond, sufficiently surrounds the at least one fastener and is directly underneath the device and in direct contact with the first substantially annular conductive material.

* * * * *